United States Patent
Qiao et al.

(10) Patent No.: US 11,567,311 B1
(45) Date of Patent: Jan. 31, 2023

(54) DEVICES WITH DISPLAYS HAVING TRANSPARENT OPENINGS

(71) Applicant: Apple Inc., Cupertino, CA (US)

(72) Inventors: Yi Qiao, San Jose, CA (US); Jean-Pierre S. Guillou, Los Gatos, CA (US); Ming Xu, Cupertino, CA (US); Yue Cui, Campbell, CA (US)

(73) Assignee: Apple Inc., Cupertino, CA (US)

( * ) Notice: Subject to any disclaimer, the term of this patent is extended or adjusted under 35 U.S.C. 154(b) by 5 days.

(21) Appl. No.: 17/208,351

(22) Filed: Mar. 22, 2021

Related U.S. Application Data

(60) Provisional application No. 63/025,008, filed on May 14, 2020.

(51) Int. Cl.
*H01L 27/32* (2006.01)
*G02B 26/02* (2006.01)
*H01L 51/52* (2006.01)

(52) U.S. Cl.
CPC ........ *G02B 26/023* (2013.01); *H01L 27/3227* (2013.01); *H01L 51/5262* (2013.01)

(58) Field of Classification Search
CPC .............. G02B 26/023; H01L 27/3227; H01L 51/5262
See application file for complete search history.

(56) References Cited

U.S. PATENT DOCUMENTS

| | | | |
|---|---|---|---|
| 6,977,705 B1 | 12/2005 | Chiang et al. | |
| 8,179,381 B2 | 5/2012 | Frey et al. | |
| 8,284,332 B2 | 10/2012 | Geaghan et al. | |
| 9,341,846 B2 | 5/2016 | Popovich et al. | |
| 9,519,154 B2 | 12/2016 | Bell | |
| 10,268,884 B2* | 4/2019 | Dones | G06F 3/0421 |
| 2008/0165267 A1 | 7/2008 | Cok | |
| 2012/0300307 A1 | 11/2012 | Borrelli et al. | |
| 2018/0052276 A1 | 2/2018 | Klienman et al. | |
| 2019/0041658 A1 | 2/2019 | Gollier et al. | |
| 2019/0250450 A1* | 8/2019 | Li | G02F 1/13471 |
| 2019/0377858 A1 | 12/2019 | He et al. | |
| 2021/0193967 A1* | 6/2021 | Xu | H01L 27/3276 |
| 2021/0351255 A1* | 11/2021 | Chang | H01L 27/326 |

FOREIGN PATENT DOCUMENTS

| WO | WO-2020119044 A1 * | 6/2020 | H01L 27/3227 |
|---|---|---|---|
| WO | WO-2021000625 A1 * | 1/2021 | H01L 27/3227 |

* cited by examiner

*Primary Examiner* — Donald L Raleigh
(74) *Attorney, Agent, or Firm* — Treyz Law Group, P.C.; Joseph F. Guihan

(57) ABSTRACT

An electronic device may include a display and an optical sensor formed underneath the display. The electronic device may include a plurality of transparent windows that overlap the optical sensor. Each transparent window may be devoid of thin-film transistors and other display components. The plurality of transparent windows is configured to increase the transmittance of light through the display to the sensor. The transparent windows may have non-periodic portions to mitigate diffraction artifacts in light that passes through the display to the optical sensor. The transparent windows may be shifted by a random amount in a random direction relative to a grid defining point and/or may be randomly rotated to increase the non-periodicity. A transparency gradient may be formed between the transparent windows and the surrounding opaque portion of the display. The transparent windows may be defined by non-linear edges.

20 Claims, 12 Drawing Sheets

DEVICES WITH DISPLAYS HAVING TRANSPARENT OPENINGS

This application claims the benefit of provisional patent application No. 63/025,008, filed May 14, 2020, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The electronic device may include a plurality of non-pixel regions that overlap the optical sensor. Each non-pixel region may be devoid of thin-film transistors and other display components. The plurality of non-pixel regions is configured to increase the transmittance of light through the display to the sensor. The non-pixel regions may therefore be referred to as transparent windows in the display.

The transparent windows may have non-periodic portions to mitigate diffraction artifacts in light that passes through the display to the optical sensor. The transparent windows may be shifted by a random amount in a random direction relative to a grid defining point (e.g., a uniform grid). Additionally, the transparent windows may be randomly rotated to increase the non-periodicity. A transparency gradient may be formed between the transparent windows and the surrounding opaque portion of the display.

The transparent windows may be defined by non-linear edges. Each transparent window may be defined by wavy edges that include a plurality of curved protrusions. The curved protrusions may optionally have different heights and/or pitches for additional non-periodicity. In another possible arrangement, the transparent windows may be defined by random outlines.

DETAILED DESCRIPTION

Figure 1:
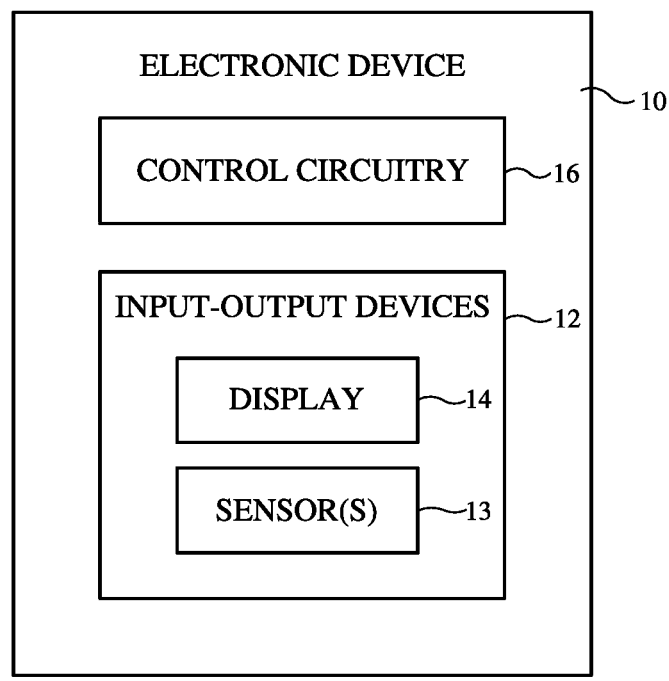
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
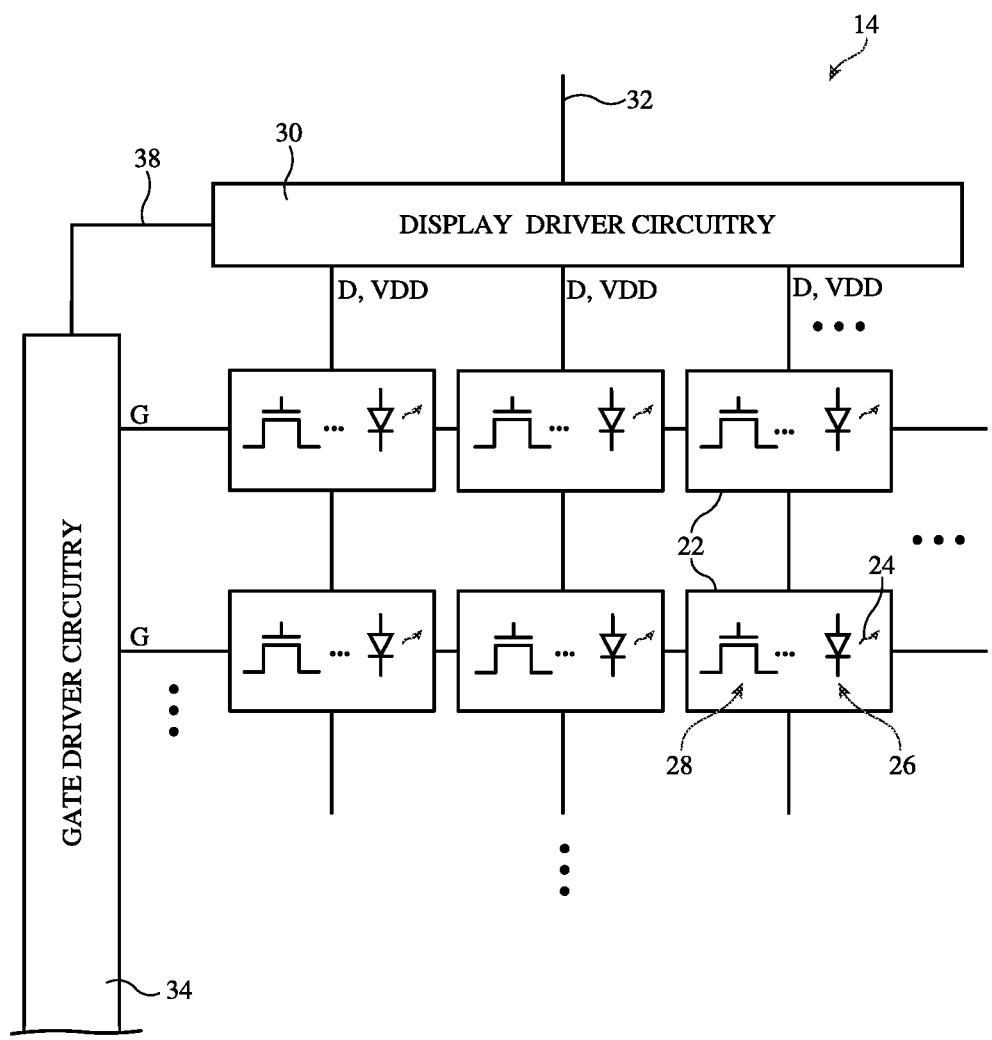
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
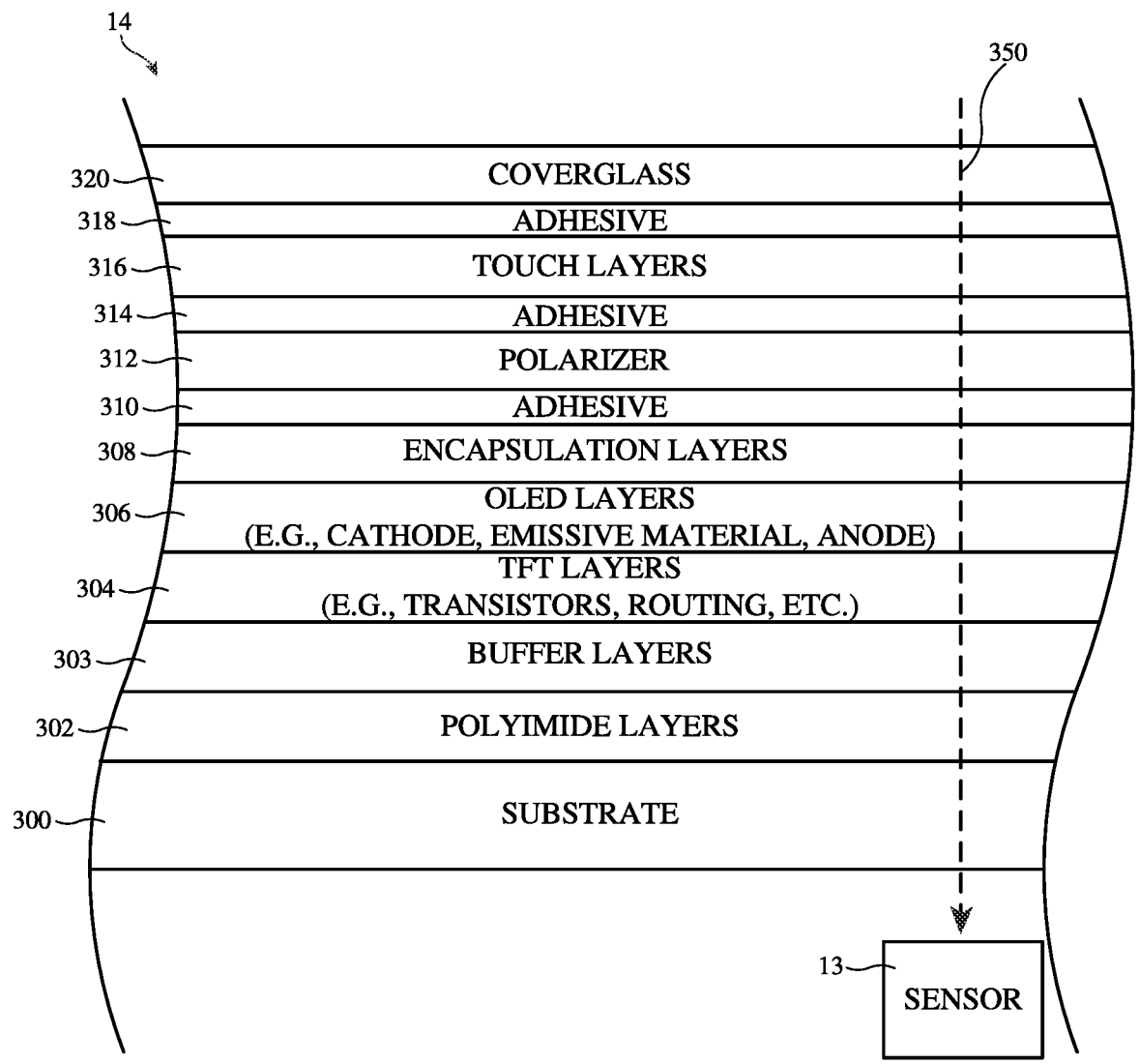
FIG. 3 is a cross-sectional side view of an illustrative display stack that at least partially covers a sensor in accordance with an embodiment.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a coverglass layer 320 that is formed over the touch layers 316 using additional adhesive 318 (e.g., OCA material). Cover glass 320 may serve as an outer protective layer for display 14.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In such scenarios, the performance of sensor 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions. Removing display pixels (e.g., removing transistors and/or capacitors associated with one or more sub-pixels) in the pixel free regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
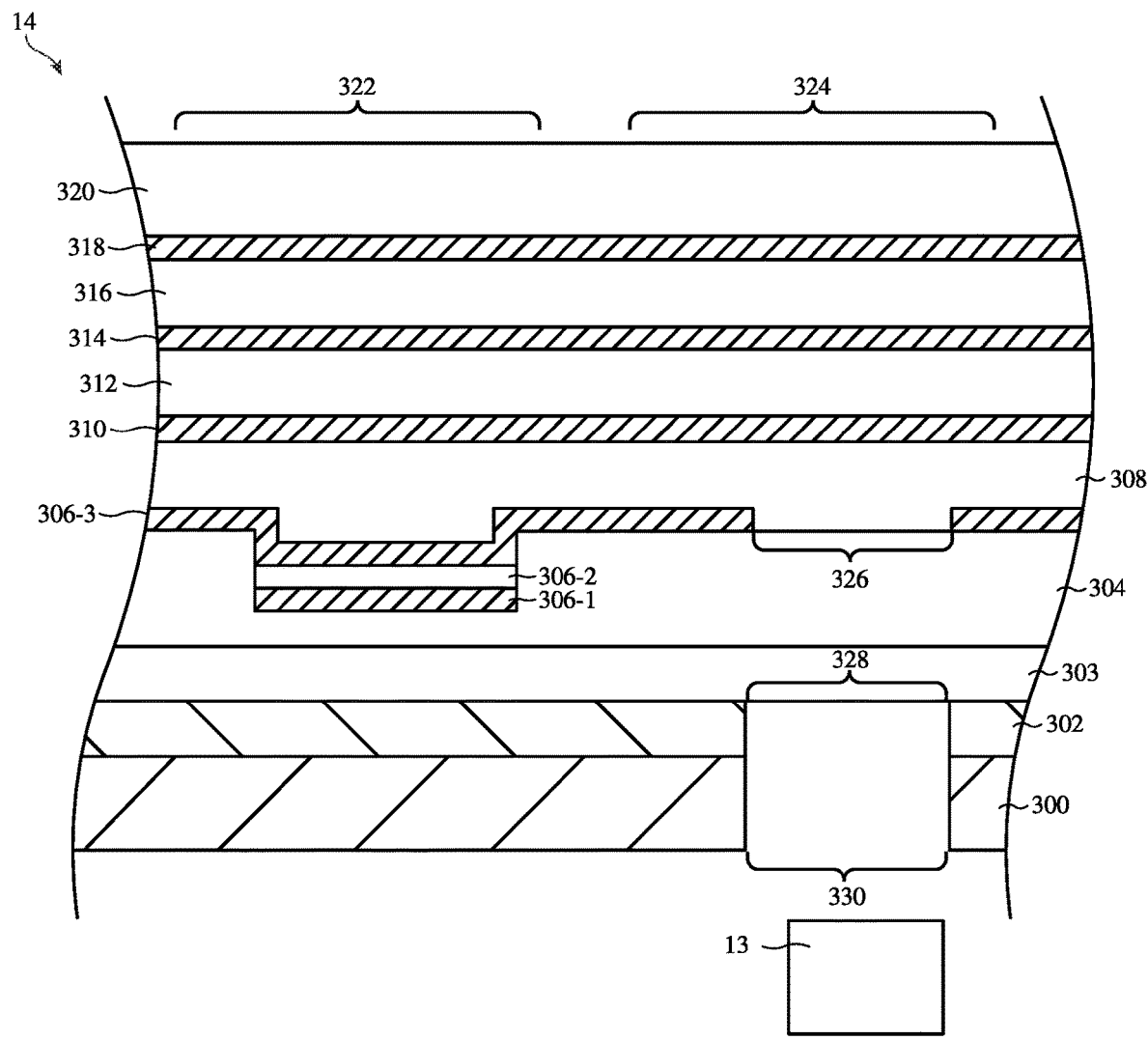
FIG. 4 is a cross-sectional side view of an illustrative display stack with a pixel removal region that includes an opening in a substrate layer in accordance with an embodiment.

FIG. 4 is a cross-sectional side view of an illustrative display showing how pixels may be removed in a pixel removal region to increase transmission through the display. As shown in FIG. 4, display 14 may include a pixel region 322 and a pixel removal region 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In pixel removal region 324, anode 306-1 and emissive material 306-2 may be omitted. Without the pixel removal region, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in pixel removal area to increase transmittance.

Additional transmission improvements through the display stack may be obtained by selectively removing additional components from the display stack in pixel removal area 324. As shown in FIG. 4, a portion of cathode 306-3 may be removed in pixel removal region 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in pixel removal region 324 during the original cathode deposition and formation steps.

Polyimide layers 302 may be removed in pixel removal region 324 in addition to cathode layer 306-3. The removal of the polyimide layers 302 results in an opening 328 in the pixel removal region. Said another way, the polyimide layer may have polyimide material that defines an opening 328 in the pixel removal region. The polyimide layers may be removed via etching (e.g., laser etching or plasma etching). Alternatively, the polyimide layers may be patterned to have an opening in pixel removal region 324 during the original polyimide formation steps. Removing the polyimide layer 302 in pixel removal region 324 may result in additional transmittance of light to sensor 13 in pixel removal region 324.

Substrate 300 may be removed in pixel removal region 324 in addition to cathode layer 306-3 and polyimide layer 302. The removal of the substrate 300 results in an opening 330 in the pixel removal region. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in pixel removal region 324 during the original substrate formation steps. Removing the substrate 300 in pixel removal region 324 may result in additional transmittance of light to sensor 13 in pixel removal region 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

Figure 5:
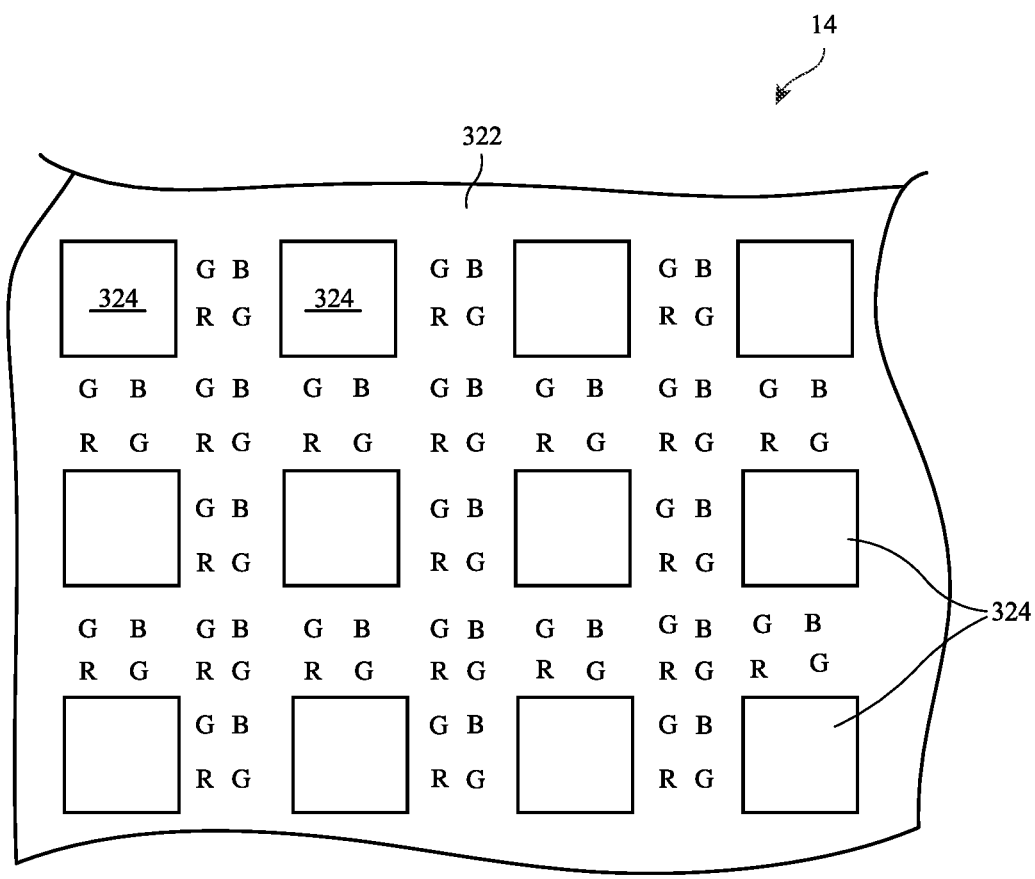
FIG. 5 is a top view of an illustrative display with transparent openings that overlap a sensor in accordance with an embodiment.

FIG. 5 is a top view of an illustrative display showing how pixel removal regions may be incorporated into the display. As shown, the display may include a plurality of pixels. In FIG. 5, red pixels are represented with an 'R', blue pixels are represented with a 'B', and green pixels are represented with a 'G'. The red, blue, and green pixels may be arranged in any desired pattern. In pixel removal areas 324, no pixels are included in the display (even though pixels would normally be present if the normal pixel pattern was followed).

As shown in FIG. 5, display 14 may include an array of pixel removal regions 324. Each pixel removal region 324 is a discrete island that is surrounded by pixel region 322. Each pixel removal region 324 may have an increased transparency compared to pixel region 322. Therefore, the pixel removal regions 324 may sometimes be referred to as transparent windows 324, transparent display windows 324, transparent openings 324, transparent display openings 324, etc. The transparent display windows may allow for light to be transmitted to an underlying sensor, as shown in FIG. 4. The transparency of transparent openings 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display to an underlying sensor 13.

In general, the display subpixels may be partially removed from any region(s) of display 14. Display 14 may have one or more localized regions in which the pixels are selectively removed. The display may have various local pixel removal regions physically separated from one another (e.g., a first display area with a plurality of transparent windows 324 and a second, separate display area with a plurality of transparent windows 324). The various local areas might for example correspond to different sensors formed underneath display 14 (e.g., a first sensor under the first display area and a second sensor under the second display area). Display 14 may include transparent windows with one or more underlying sensors along the top border of display 14, at a corner of display 14 (e.g., a rounded corner of display 14), in the center portion along the top edge of the display (e.g., a notch area in the display), etc. The areas in display 14 with transparent windows 324 may have different shapes and sizes.

The shape of transparent windows 324 may impact the light received by a sensor underneath the display. In some cases, such as in FIG. 5, the array of transparent windows has a periodic arrangement. As shown in FIG. 5, the transparent windows 324 have a regular, repeating shape and are arranged in a uniform grid. These repetitive structures may create artifacts when light (e.g., the light received by sensor 13) passes through the display. Diffraction of environmental light that passes through the display to the sensor results in undesirable visible artifacts caused by diffraction such as rainbow effects and diffraction spikes.

Figure 6A:
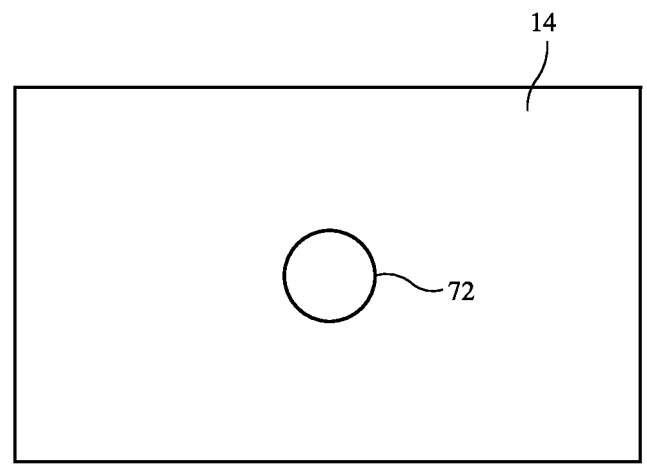
FIGS. 6A and 6B are rear views of an illustrative display showing the appearance of a point light source viewed through the display at a sensor in accordance with an embodiment.
Figure 6B:
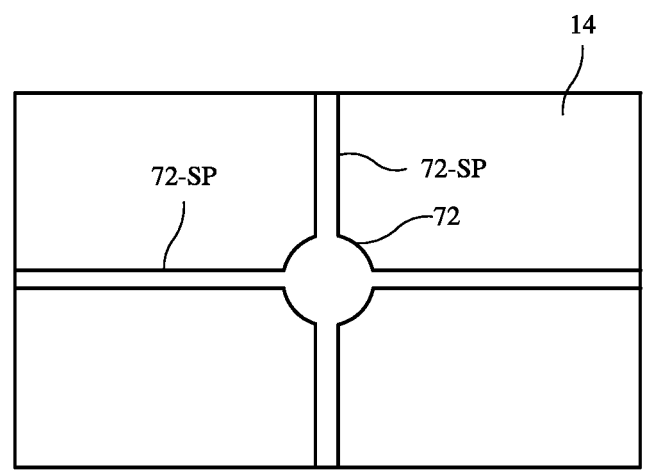

An example of these diffraction effects is shown in FIGS. 6A and 6B. In particular, consider the example of a point light source that is captured by sensor 13 through display 14. When the sensor captures an image of the point light source through the display, the point light source should (ideally) appear as a circular area of light. FIG. 6A shows an example of this type, with the light from the point source appearing over area 72. In FIG. 6A (e.g., in an ideal scenario where no diffraction artifacts are present), area 72 has a circular shape without additional spikes or rainbow effects. In practice, the repeating structures of FIG. 5 may result in area 72 having an appearance as shown in FIG. 6B. As shown, area 72 in FIG. 6B includes spike portions 72-SP in addition to a circular portion.

These types of diffraction artifacts are undesirable. However, there are numerous ways to mitigate these types of diffraction artifacts while still including the transparent windows in the display. In general, to mitigate diffraction artifacts, the shapes of the transparent windows may be selected to include non-periodic portions (e.g., to include randomness and reduce periodicity).

Figure 7A:
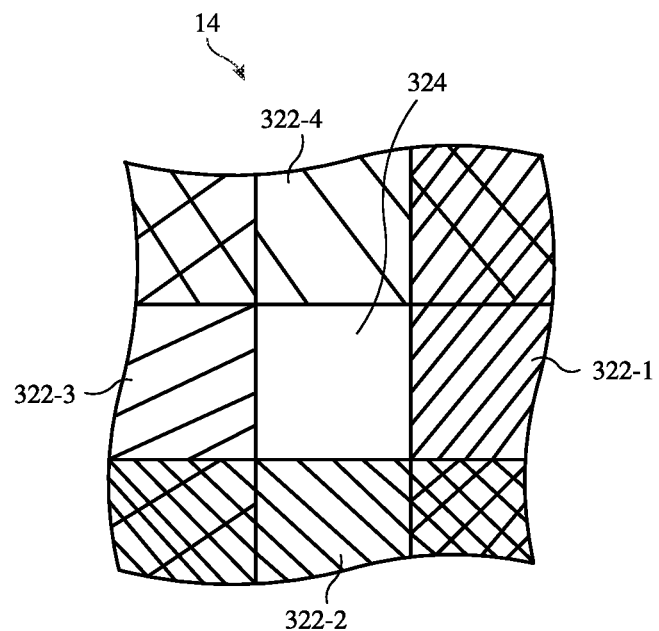
FIG. 7A is a top view of an illustrative display having a transparent window with edges defined by multiple opaque display layers in accordance with an embodiment.

It should be noted that the opaque portion 322 of display 14 may be formed from one or more different layers of material. In general, any layer within opaque portion 322 may be used to define transparent window 324. FIG. 7A is a top view of an illustrative display showing how multiple different opaque layers may combine to collectively define window 324. As shown in FIG. 7A, the opaque display portion 322 includes opaque layers 322-1, 322-2, 322-3, and 322-4. Each opaque layer may have a transparency less than 25%, less than 20%, less than 10%, less than 5%, etc. As shown, opaque layer 322-1 is positioned on the right edge of transparent window 324, opaque layer 322-2 is positioned on the lower edge of transparent window 324, opaque layer 322-3 is positioned on the left edge of transparent window 324, and opaque layer 322-4 is positioned on the upper edge of transparent window 324. The opaque layers 322-1, 322-2, 322-3, and 322-4 may be formed in different planes and may optionally overlap in one or more areas. Ultimately, the opaque layers in combination define a transparent window 324 that allows light to pass through to the underlying sensor 13.

The layers that define transparent window 324 (e.g., layers 322-1, 322-2, 322-3, and 322-4 in FIG. 7A) may be an existing metal routing layer in the display stackup (e.g., metal layer from TFT layers 304 or OLED layers 306), a pixel definition layer (e.g., a black pixel defining layer), and/or any other desired opaque layer (e.g., any other opaque metal or dielectric layer included in the display).

Figure 7B:
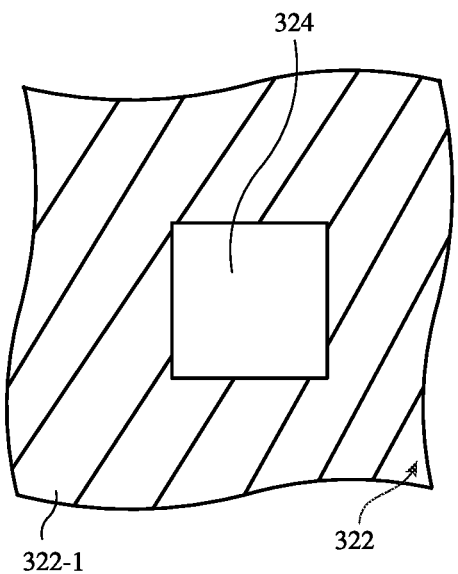
FIG. 7B is a top view of an illustrative display having a transparent window with edges defined by a single opaque display layer in accordance with an embodiment.

In another example, shown in FIG. 7B, a single layer may be used to define transparent window 324. As shown in FIG. 7B, the opaque footprint 322 is defined by opaque layer 322-1. Opaque layer 322-1 may have a transparency less than 25%, less than 20%, less than 10%, less than 5%, etc. Opaque layer 322-1 may be an opaque metal or dielectric layer that is included in the display for defining the opening shape of transparent window 324. In other words, the opaque layer's only function may be defining the opaque footprint of the display. This example is merely illustrative, and the opaque layer may have other display functions if desired (e.g., pixel definition layer, signal routing, etc.).

To mitigate artifacts caused by diffraction of light passing through the transparent windows in the display, the shape of the transparent windows may be selected to include non-periodic portions (e.g., to include randomness and reduce periodicity). FIGS. 8-12 show various ways that the transparent windows may include non-periodic portions to mitigate diffractive artifacts.

Figure 8:
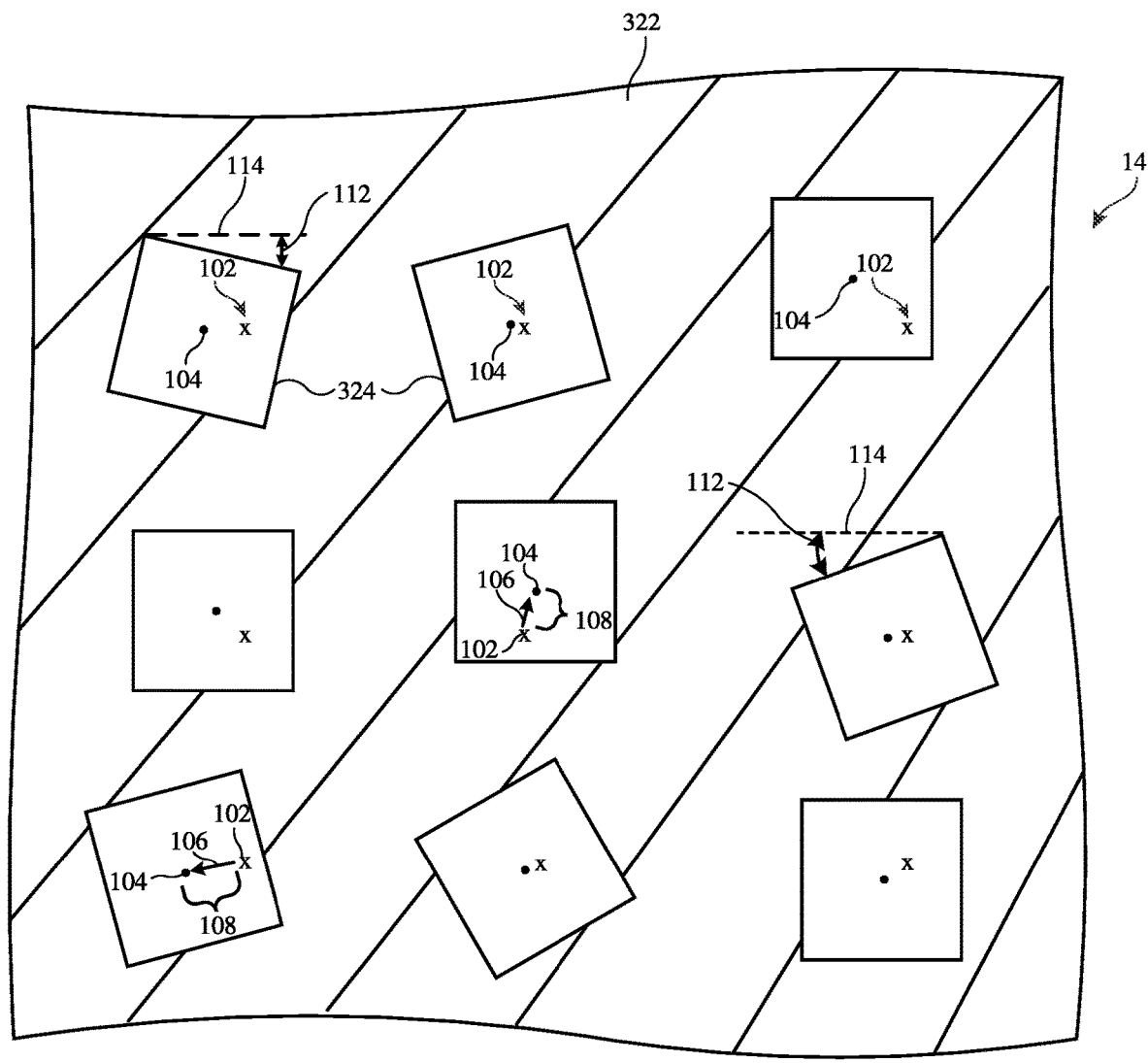
FIG. 8 is a top view of an illustrative display having transparent windows that are shifted by a random amount and rotated by a random amount in accordance with an embodiment.

FIG. 8 is a top view of an illustrative display with transparent windows that have the same shape but a randomized rotation and a randomized shift. As shown, display 14 includes an opaque portion 322 (that includes display pixels) and transparent windows 324 (that do not include pixels). The transparent windows 324 may overlap a sensor (e.g., sensor 13 as shown in FIG. 3). As discussed in connection with FIG. 7A and FIG. 7B, the footprint of opaque portion 322 may be defined by one more layers as desired.

The transparent windows may be formed in an array (e.g., rows and columns of transparent windows). In the example of FIG. 5, the transparent windows are arranged in a uniform grid having evenly spaced rows and columns. A uniform grid of this type may have corresponding anchor points 102 shown in FIG. 8. The anchor points 102 (sometimes referred to as grid defining points 102, uniform grid defining points 102, uniform grid points 102, etc.) are arranged in a uniform grid of evenly spaced rows and columns. In other words, the anchor points are arranged according to a periodic (repeating) pattern.

To reduce periodicity in the arrangement of the transparent windows, each transparent window may be shifted by a random amount in a random direction from its corresponding anchor point. In other words, each transparent window has a corresponding center 104. The transparent windows could have centers aligned with the anchor points 102, but this periodic arrangement may have associated diffractive artifacts. Instead, shifting the centers 104 away from anchor points 102 by a random amount in a random direction mitigates periodicity.

FIG. 8 shows how each transparent window 324 has a center that is shifted in a corresponding direction 106 by a distance 108. The shift direction 106 may be any direction within the plane of the display (e.g., any direction between and including 0° and 360°). The shift distance 108 may be any desired distance within some predetermined limit (e.g., between 0 and a maximum allowable shift). The maximum allowable shift distance may be defined relative to the size of the transparent window. For example, the maximum allowable shift distance may be selected to be half of the width of the transparent window, equal to the width of the transparent window, less than half of the width of the transparent window, etc. The maximum allowable shift distance may be defined relative to the distance between adjacent anchor points (e.g., in a given row or given column). For example, the maximum allowable shift distance may be selected to be a quarter of the distance between adjacent anchor points in a given row, half of the distance between adjacent anchor points in a given row, etc. The maximum allowable shift distance may also be defined as an absolute distance (e.g., 50 microns, 100 microns, less than 50 microns, less than 100 microns, greater than 50 microns, greater than 100 microns, greater than 200 microns, between 25 and 150 microns, between 50 and 100 microns, etc.).

The shifting of each transparent window relative to its corresponding anchor point may be referred to as a shift or displacement of the transparent window. In addition to this shift, each transparent window may be rotated by a random amount. FIG. 8 shows how each transparent window is rotated by an angle 112 relative to a reference line 114. The reference line 114 may be, for example, an edge of the display, an edge of the electronic device, a line parallel to the rows of anchor points or the columns of anchor points, etc. In other words, the reference line defines where the edge of the transparent window would be positioned without the randomized rotation.

The angle of rotation 112 may be defined as the smaller of complementary angles and therefore may always be less than 45°. In general, angle 112 may be any angle between 0° and 45°. In some embodiments, angle 112 may be selected as an angle between 0° and another desired maximum angle (e.g., 10°, 20°, 30°, 40°, less than 45°, less than 40°, less than 30°, less than 20°, less than 10°, etc.). The transparent windows are therefore rotated relative to one another.

In the example of FIG. 8, each transparent window has both a randomized shift and a randomized rotation. This example is merely illustrative, and the transparent window may have only a randomized shift or only a randomized rotation if desired. In one embodiment, such as the embodiment shown in FIG. 8, each transparent window may be independently randomized. There may be as many unique shifts and/or rotations as there are transparent windows in this type of arrangement. In another possible embodiment, a subset of the transparent windows may be independently randomized, and that pattern is then repeated in different subsets of the transparent windows. In other words, a repeating unit cell includes independently randomized transparent window shapes. That repeating unit cell is then repeated across the display for other transparent windows. The unit cell of random transparent window shapes that is repeated across the display may have 9 transparent windows (e.g., a 3×3 grid), 4 transparent windows (e.g., a 2×2 grid), 25 transparent windows (e.g., a 5×5 grid), 100 transparent windows (e.g., a 10×10 grid), more than 50 transparent windows, more than 100 transparent windows, less than 200 transparent windows, between 50 and 150 transparent windows, more than 10 transparent windows, etc.

In general, the transparent windows in the display may include any desired number of unique shifts due to the randomization (e.g., more than 1, more than 2, more than 4, more than 9, more than 25, more than 100, more than 50, more than 150, more than 250, more than 500, less than 500, less than 250, less than 150, less than 100, between 4 and 200, etc.). Similarly, the transparent windows in the display may include any desired number of unique rotations due to the randomization (e.g., more than 1, more than 2, more than 4, more than 9, more than 25, more than 100, more than 50, more than 150, more than 250, more than 500, less than 500, less than 250, less than 150, less than 100, between 4 and 200, etc.).

Another way to mitigate diffraction artifacts caused by the transparent windows is using apodization. Apodization may refer to smoothly transitioning the opacity between the opaque portion and the transparent portion of the display. In the examples of FIG. 5 and FIG. 8, each transparent window has a given shape. The entire given shape is transparent and the surrounding area is opaque. There is therefore a sharp step in transparency between the opaque portion and the transparent portion. Apodization (sometimes referred to herein as transparency tapering or transparency smoothing) may be used to smooth out the transition between opaque and transparent portions.

Figure 9A:
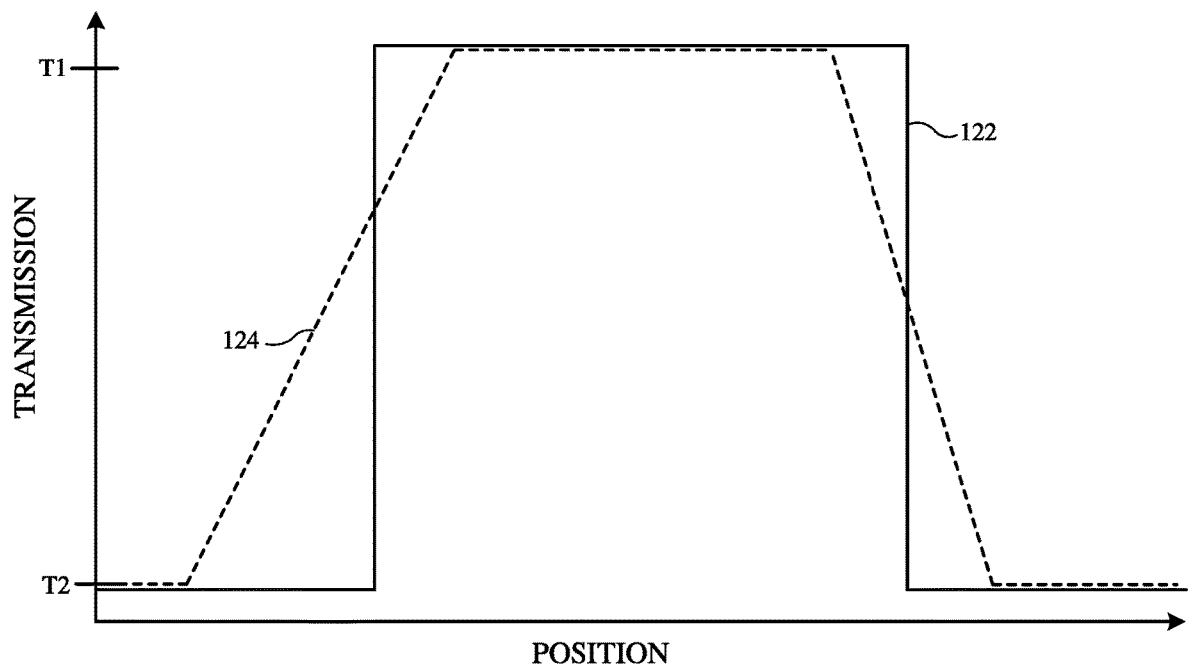
FIG. 9A is a graph of illustrative transparency profiles for the transparent windows of the display in accordance with an embodiment.

FIG. 9A is a graph showing how transmission may change as a function of position within the display. Profile 122 reflects the transmission as a function of position for a display of the type shown in FIG. 5 or FIG. 8. As shown, the transmission follows a step function. In the opaque areas of the display (e.g., portion 322 in FIG. 8), the transmission may be at T2. Within the transparent window 324, the transmission may be at T1. T1 may be higher than T2 (e.g., by 10%, more than 10%, more than 20%, more than 40%, more than 50%, more than 70%, etc.). The transmission therefore abruptly jumps from the lower level at T2 to the higher level at T1 when transitioning to the transparent window.

Apodization results in the transparency being smoothed between the opaque display portion and the transparent window. Profile 124 shows this type of gradual transition between transmission levels. As shown, profile 124 still has a maximum level of T1 and a minimum level of T2. However, the transmission changes gradually between these two extremes.

Figure 9B:
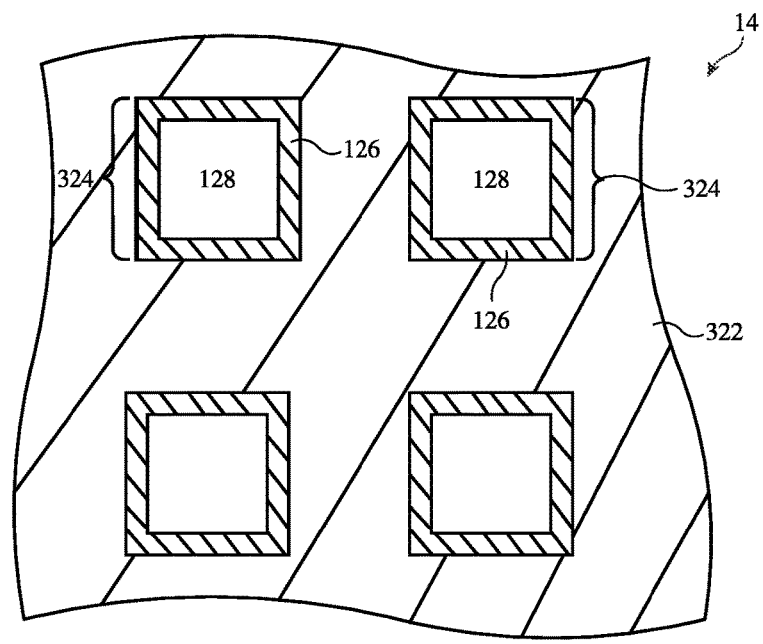
FIG. 9B is a top view of an illustrative display having transparent windows with a transparency transition region in accordance with an embodiment.

FIG. 9B is a top view of a display with apodized transparent windows. As shown, each transparent window 324 includes a transparency transition area 126 between an opaque region 322 (e.g., a display region with the minimum transmission T2) and a transparent region 128 (e.g., a display region with the maximum transmission T1). The transition area 126 may transition the transmission between the minimum transition level and the maximum transition level.

This transition area 126 may be formed by an opaque layer having a varying thickness. For example, the thickness of the opaque layer may gradually be reduced from a maximum thickness at the interface with opaque portion 322 and a minimum thickness at the interface with transparent portion 128. In another possible example, halftone transparency smoothing may be used (with opaque dots becoming sparser in density with closer distance of the transparent portion).

Figure 10:
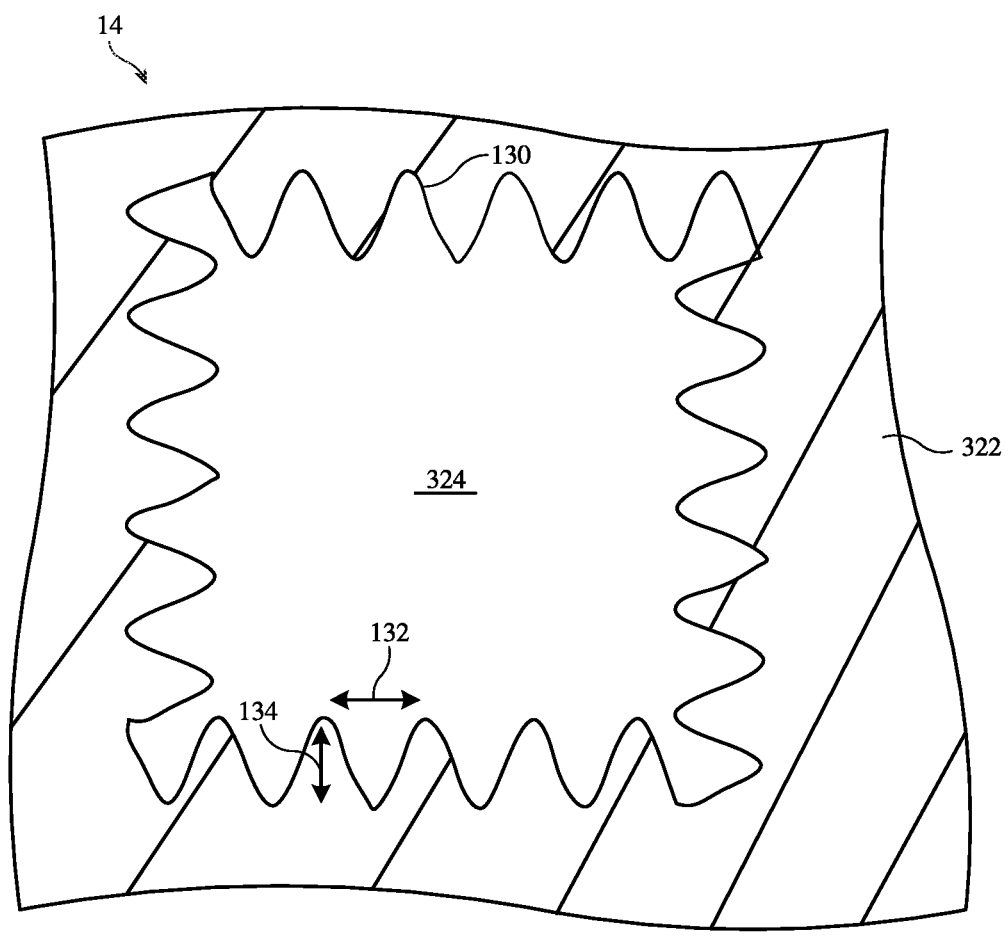
FIG. 10 is a top view of an illustrative display having a transparent window defined by wavy edges in accordance with an embodiment.

The transparent windows may have non-linear edges to mitigate diffractive artifacts. FIG. 10 is a top view of an illustrative transparent window 324 that has non-linear edges. In particular, the edges 130 of transparent window 324 may have one or more curved portions. As shown in FIG. 10, the transparent window 324 may have a plurality of curved portions in a sinusoidal type pattern. The edges of the transparent window in FIG. 10 may sometimes be described as sinusoidal, serpentine, wavy, jagged, serrated, etc.

The design of the sinusoidal edges of the transparent window may vary or may be uniform around the perimeter of the transparent window. Each curved portion of the wavy edge of FIG. 10 may be referred to as a protrusion. Each curved protrusion may have a corresponding height 134. Adjacent protrusions may be separated by a pitch 132. The pitch and height of the protrusions may be the same for all of the protrusions. Alternatively, the pitch and/or height of the protrusions may be at least partially randomized to further mitigate diffractive artifacts. For example, there may be a baseline pitch and a baseline height for the protrusions. During randomization, the actual height may be selected as a value that is ±10% of the baseline height, ±20% of the baseline height, ±40% of the baseline height, ±60% of the baseline height, etc. Similarly, during randomization, the actual pitch may be selected as a value that is ±10% of the baseline pitch, ±20% of the baseline pitch, ±40% of the baseline pitch, ±60% of the baseline pitch, etc.

The baseline protrusion height (that may be uniform around the entire window or may be randomized as discussed above) may be 5 microns, more than 2 microns, more than 4 microns, more than 10 microns, more than 20 microns, less than 50 microns, less than 15 microns, between 1 and 10 microns, etc. The baseline protrusion pitch (that may be uniform around the entire window or may be randomized as discussed above) may be 5 microns, more than 2 microns, more than 4 microns, more than 10 microns, more than 20 microns, less than 50 microns, less than 15 microns, between 1 and 10 microns, etc.

In one possible arrangement, every transparent window may have the shape shown in FIG. 10. In other words, only one unique shape may be used for the transparent windows, but the unique shape has sufficient non-periodicity to mitigate diffractive artifacts in light passing through the transparent windows. The unique shape may optionally include randomization within the included wavy edges. This example is merely illustrative. If desired, variations of the transparent window with sinusoidal edges shown in FIG. 10 may be used for different transparent windows within a single display. Different transparent windows may have sinusoidal edges that are independently randomized, for example. A repeating unit cell of transparent windows with different sinusoidal edges may be repeated across the transparent windows in the display.

Figure 11:
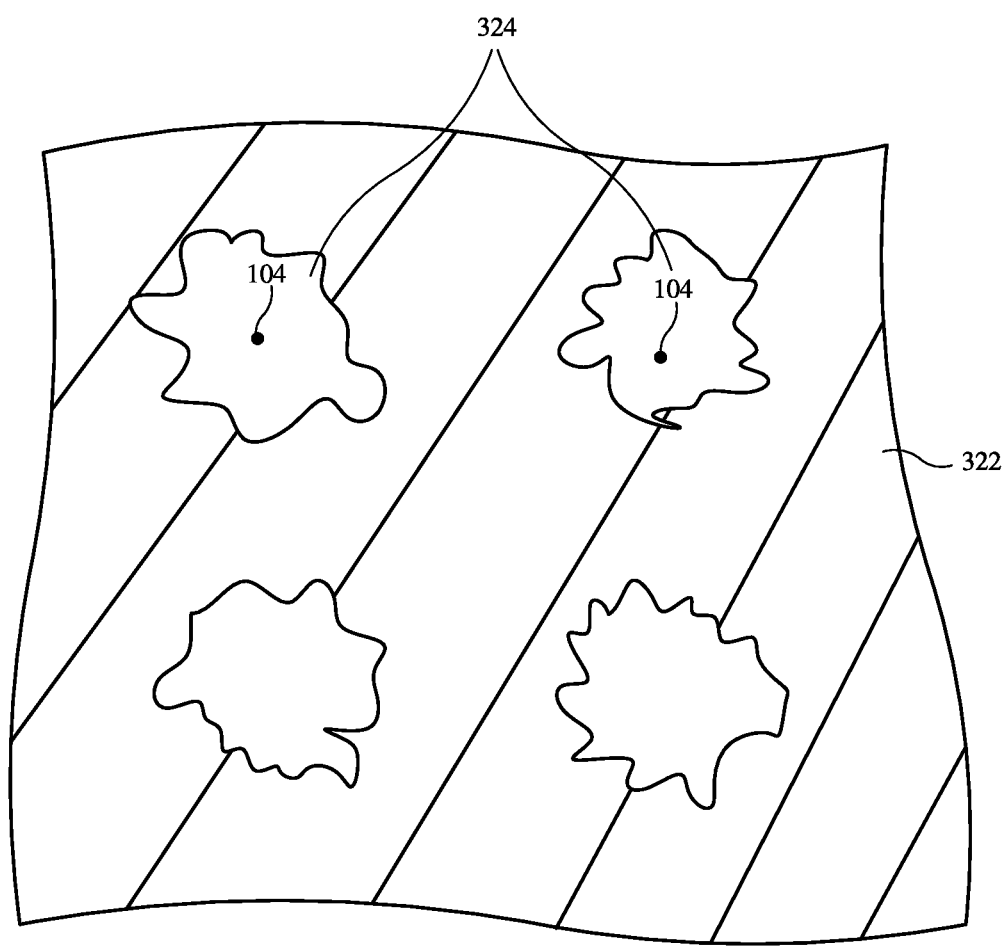
FIG. 11 is a top view of an illustrative display having transparent windows that are defined by random outlines in accordance with an embodiment.

In another possible embodiment, shown in FIG. 11, the transparent windows may have a randomly defined shape. Each transparent window 324 in FIG. 11 has a corresponding center 104. The perimeter of the transparent window may be randomly chosen. For example, a plurality of points around the center may be selected within a given range (e.g., a given distance from the center). Each transparent window may have a unique random shape in one arrangement. Alternatively, a repeating unit cell of random shapes may be repeated across the transparent windows in the display.

Figure 12:
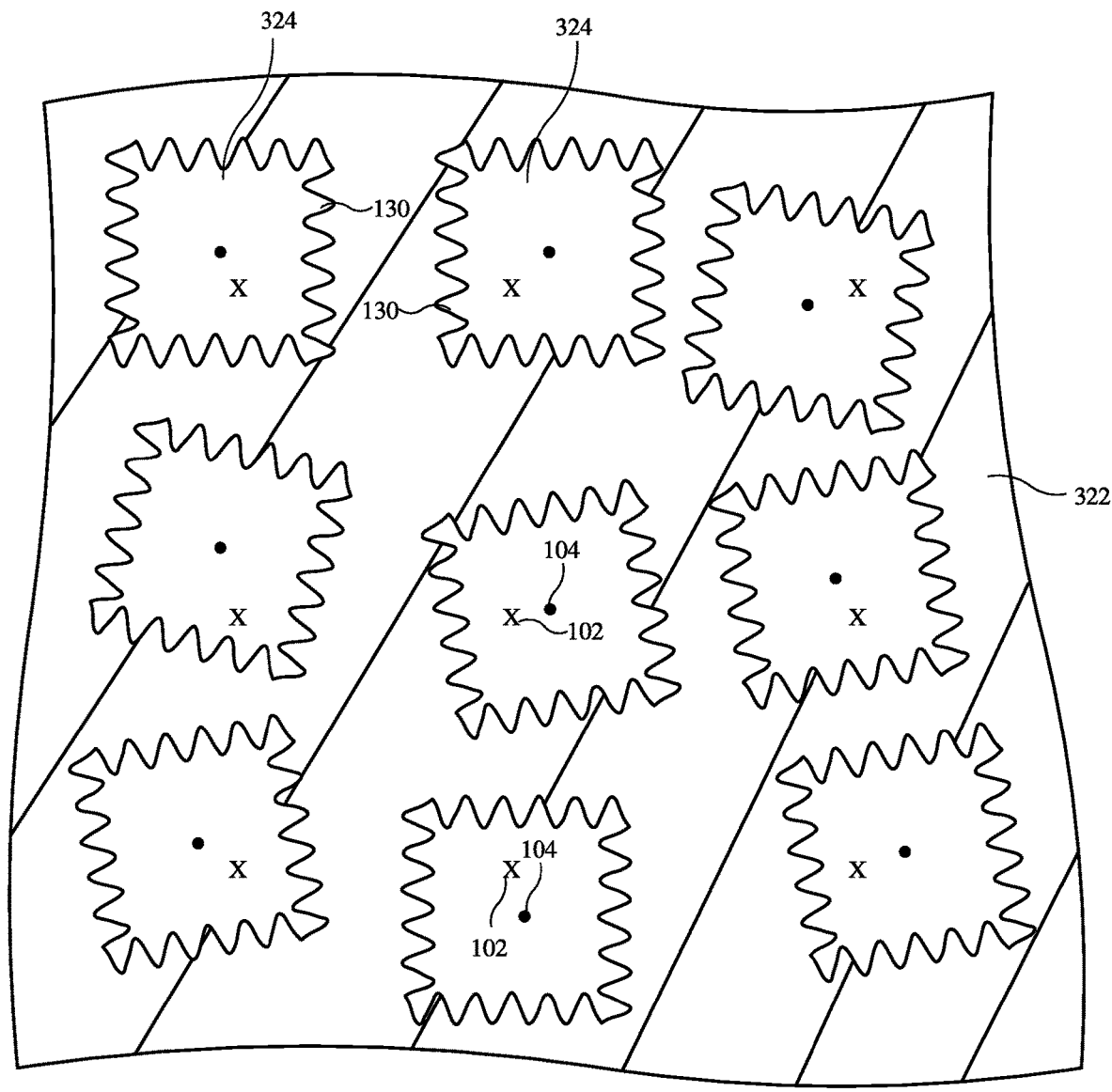
FIG. 12 is a top view of an illustrative display having transparent windows that are shifted by a random amount, that are rotated by a random amount, and that have wavy edges in accordance with an embodiment.

The randomization techniques discussed in FIGS. 8-11 may be applied in any desired combination. In general, each display may include one or more of randomized shifts (as in FIG. 8), randomized rotations (as in FIG. 8), apodization (as in FIGS. 9A and 9B), wavy edges (as in FIG. 10), and randomized outlines (as in FIG. 11) for its transparent windows. FIG. 12 is a top view of an illustrative display that includes randomized shifts, randomized rotations, and wavy edges.

As shown in FIG. 12, each transparent window 324 has a center 104 that is shifted relative to uniform grid defining point 102 by a random amount and in a random direction. Each transparent window is also rotated by a random amount. Finally, each transparent window has non-linear edges 130 as discussed in connection with FIG. 10. The combination of these non-periodic elements added to the transparent window arrangement may greatly mitigate diffractive artifacts in the display.

In each of FIGS. 8-12, display 14 includes an opaque portion 322 (that includes display pixels) and one or more transparent windows 324 (that do not include pixels). In each embodiment, the transparent windows 324 may overlap a sensor (e.g., sensor 13 as shown in FIG. 3). In each embodiment, as discussed in connection with FIG. 7A and FIG. 7B, the footprint of opaque portion 322 may be defined by one more layers as desired.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a sensor; and
   a display that overlaps the sensor, wherein the sensor is configured to sense light that passes through the display and wherein the display comprises:
   an opaque portion that includes an array of pixels; and
   a plurality of transparent windows that allow light to pass through to the sensor, wherein each transparent window is free of pixels, and wherein the plurality of transparent windows comprises non-periodic portions that mitigate diffraction artifacts.

2. The electronic device defined in claim 1, wherein each transparent window has a corresponding grid point and a respective center and wherein, for at least some of the transparent windows, the center is shifted relative to the grid point.

3. The electronic device defined in claim 2, wherein each grid point is part of a regular pattern of grid points.

4. The electronic device defined in claim 1, wherein each transparent window has a corresponding grid point and a respective center that is shifted by a random amount in a random direction relative to the grid point.

5. The electronic device defined in claim 1, wherein at least some of the transparent windows are rotated by a non-zero amount that is less than 45 degrees.

6. The electronic device defined in claim 1, wherein each transparent window is rotated by a random amount that is less than 45 degrees.

7. The electronic device defined in claim 1, wherein the opaque portion has a first transparency, wherein a transparent window of the plurality of transparent windows has a second transparency, and wherein the transparent window comprises a transparency transition area with a transparency gradient between the first transparency and the second transparency.

8. The electronic device defined in claim 1, wherein each one of the plurality of transparent windows has a tapered transparency around a respective perimeter of that transparent window.

9. The electronic device defined in claim 1, wherein a transparent window of the plurality of transparent windows has non-linear edges.

10. The electronic device defined in claim 1, wherein a transparent window of the plurality of transparent windows has edges defined by a plurality of curved protrusions.

11. The electronic device defined in claim 10, wherein the plurality of curved protrusions includes protrusions with at least two different heights.

12. The electronic device defined in claim 10, wherein the plurality of curved protrusions includes protrusions separated by at least two different pitches.

13. The electronic device defined in claim 1, wherein each transparent window is displaced by a random amount in a random direction, is rotated by a random amount, and has serrated edges.

14. An electronic device, comprising:
    a display that includes a first portion having a first transparency, a plurality of pixels in the first portion, and a plurality of pixel-free second portions that have a higher transparency than the first transparency; and
    a sensor that is overlapped by the plurality of pixel-free second portions, wherein each pixel-free second portion has an outline defined by wavy edges.

15. The electronic device defined in claim 14, wherein each pixel-free second portion in the display has the same outline.

16. The electronic device defined in claim 14, wherein the wavy edges comprise curves of at least two different heights.

17. The electronic device defined in claim 14, wherein the wavy edges comprise curves having at least two different pitches.

18. An electronic device comprising:
    a display having an array of pixels and a plurality of transparent windows; and
    a sensor that is configured to sense light that passes through the transparent windows of the display, wherein at least some of the transparent windows have centers that are shifted relative to a corresponding grid defining anchor point and wherein at least some of the transparent windows are rotated by non-zero angles relative to one another.

19. The electronic device defined in claim 18, wherein the plurality of transparent windows includes at least five discrete distances separating centers from corresponding grid defining anchor points.

20. The electronic device defined in claim 18, wherein the plurality of transparent windows includes at least five discrete rotational angles.

* * * * *